United States Patent
Ishimori et al.

(10) Patent No.: US 8,391,805 B2
(45) Date of Patent: Mar. 5, 2013

(54) RADIO FREQUENCY SWITCH

(75) Inventors: Toshifumi Ishimori, Kanagawa-ken (JP); Toshiki Seshita, Kanagawa-ken (JP); Mitsuru Sugawara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 172 days.

(21) Appl. No.: 13/052,473

(22) Filed: Mar. 21, 2011

(65) Prior Publication Data

US 2012/0049938 A1    Mar. 1, 2012

(30) Foreign Application Priority Data

Aug. 30, 2010  (JP) ................. 2010-192166

(51) Int. Cl.
*H04B 1/44*  (2006.01)

(52) U.S. Cl. .......................... 455/78; 455/83

(58) Field of Classification Search .......... 455/73, 455/78, 80, 82, 83, 550.1, 552.1, 553.1, 91, 455/115.1, 127.1; 333/102, 103, 104, 121

See application file for complete search history.

(56) References Cited

U.S. PATENT DOCUMENTS

2009/0203396 A1* 8/2009 Zhitnitsky .............. 455/552.1
2010/0099366 A1* 4/2010 Sugar et al. ................. 455/78
2012/0009886 A1* 1/2012 Poulin ........................ 455/78

FOREIGN PATENT DOCUMENTS

JP  2008-124805  5/2008
JP  2007-021841  1/2009

* cited by examiner

*Primary Examiner* — Thanh Le
(74) *Attorney, Agent, or Firm* — Turocy & Watson, LLP

(57) ABSTRACT

According to one embodiment, a semiconductor switch circuit includes a switch section, a decoder section, a DC-DC converter, a driver section, a first filter circuit, a first filter bypass circuit and a first bypass control circuit. The switch section includes an input-output terminal, radio frequency signal terminals, and semiconductor switch elements. The decoder section generates a switch control signal controlling a conduction and a non-conduction state of switch elements. The DC-DC converter generates a first potential. The driver section supplies the first and a second potential to a gate electrode of the switch elements. The first filter circuit is electrically connected between the DC-DC converter and the driver section and outputs the first potential to the driver section. The first filter bypass circuit is electrically connected with the first filter circuit. The first bypass control circuit supplies a first mode signal to the first filter bypass circuit.

20 Claims, 13 Drawing Sheets

US 8,391,805 B2

RADIO FREQUENCY SWITCH

CROSS-REFERENCE TO RELATED APPLICATIONS

This application is based upon and claims the benefit of priority from the prior Japanese Patent Application No. 2010-192166, filed on Aug. 30, 2010; the entire contents of which are incorporated herein by reference.

FIELD

Embodiments described herein relate generally to a radio frequency switch.

BACKGROUND

In mobile communication units, multiband capability is increasingly provided in conjunction with enhanced functionality. Thus, the mobile communication unit includes a plurality of transmit/receive circuits. For switching between an antenna terminal and the plurality of transmit/receive circuits, a semiconductor switch circuit is used. To achieve downsizing and power consumption reduction of the semiconductor switch circuit, a MOSFET (metal oxide semiconductor field effect transistor) is used as a semiconductor switch element for switching between the terminals. In order for the semiconductor switch circuit to have output characteristics with low loss and low distortion, the gate electrode of the MOSFET needs to be supplied with an appropriate gate potential. To obtain an appropriate gate potential by step-up or step-down from a power supply voltage, the semiconductor switch circuit includes therein a DC-DC converter including an oscillator and a charge pump. The oscillator generates harmonic noise in the output characteristics of the semiconductor switch circuit. Thus, a low-pass filter is inserted between the DC-DC converter and the semiconductor switch element. The low-pass filter reduces harmonic noise, but impairs the switching response of the semiconductor switch circuit.

DETAILED DESCRIPTION

Figure 1:
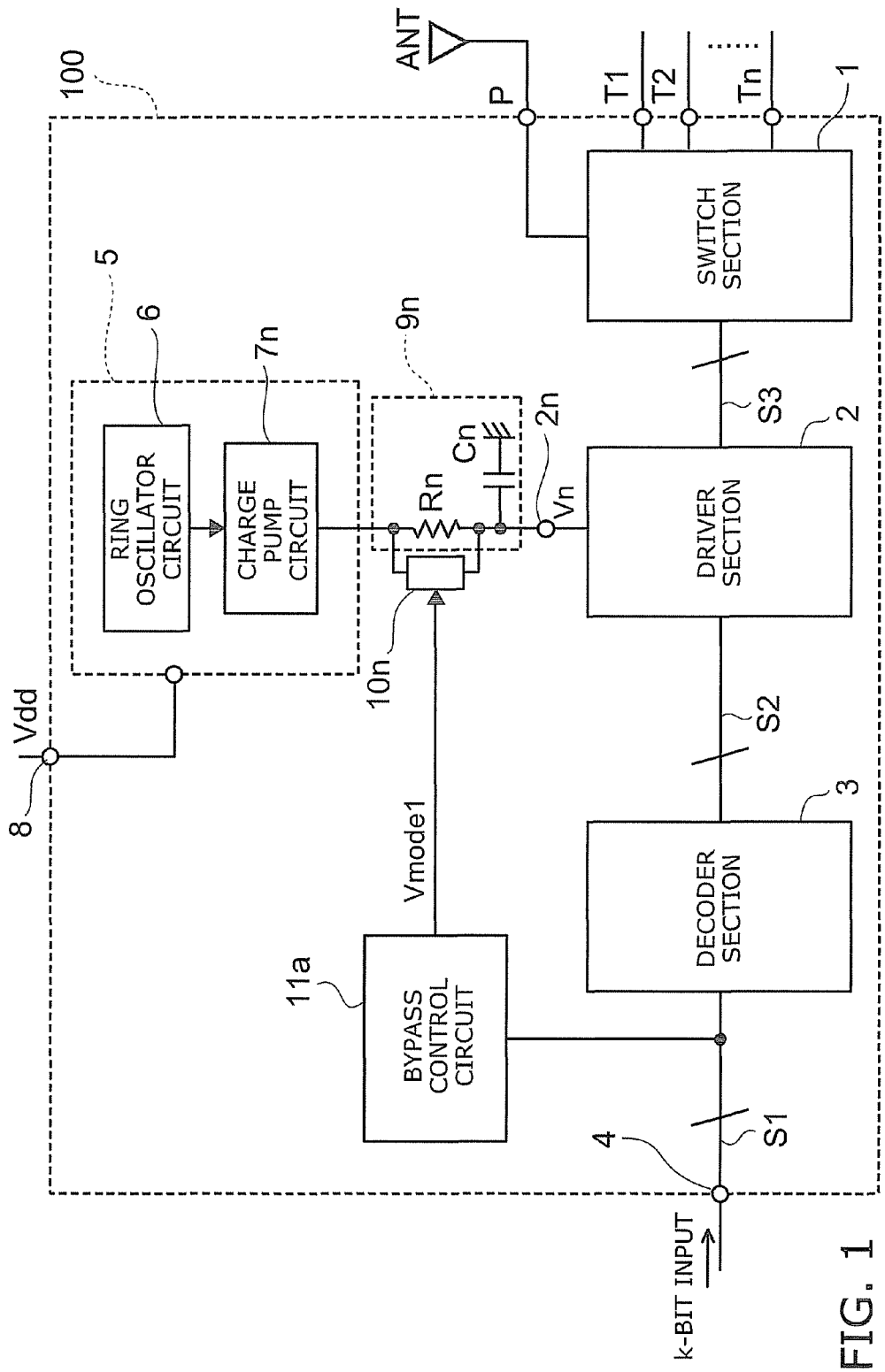
FIG. 1 is a block diagram of a semiconductor switch circuit of a first embodiment.

In general, according to one embodiment, a semiconductor switch circuit includes a switch section, a decoder section, a DC-DC converter, a driver section, a first filter circuit, a first filter bypass circuit and a first bypass control circuit. The switch section includes an input-output terminal, a plurality of radio frequency signal terminals, and a plurality of semiconductor switch elements each electrically connected between the input-output terminal and one of the plurality of radio frequency signal terminals. The decoder section is configured to generate a switch control signal controlling a conduction state and a non-conduction state of each of the plurality of semiconductor switch elements based on a terminal switching control signal switching the conduction state and the non-conduction state between the input-output terminal and the plurality of radio frequency signal terminals. The DC-DC converter is configured to generate a first potential. The driver section is configured to supply the first potential to a gate electrode of the semiconductor switch element placed in one state of the conduction state and the non-conduction state out of the plurality of semiconductor switch elements, and to supply a second potential to a gate electrode of the semiconductor switch element placed in one other state of the conduction state and the non-conduction state. The first filter circuit is electrically connected in series between the DC-DC converter and the driver section and is configured to output the first potential to the driver section. The first filter bypass circuit is electrically connected in parallel with the first filter circuit. The first bypass control circuit is configured to supply a first mode signal to the first filter bypass circuit so that when the conduction state and the non-conduction state between one of the plurality of radio frequency signal terminals and the input-output terminal are switched, the first filter bypass circuit is placed in the conduction state.

Various embodiments will now be described hereinafter with reference to the accompanying drawings. The figures used in describing the embodiments are schematic for ease of description. The shape, dimension, and size relation of components in the figures do not necessarily need to be identical to those shown in the figures when they are actually put into practice, but can be suitably modified as long as the effect of the invention is achieved.

The radio frequency switch provided between the antenna and the transceiver circuit can be, e.g., an SPDT (single pole double throw) composed of one antenna terminal and two input-output terminals, a DPDT (double pole double throw) composed of two antenna terminals and two input-output terminals, an SPnT (single pole n throw) composed of one antenna terminal and many input-output terminals, or a DPnT (double pole n throw) composed of two antenna terminals and many input-output terminals. The embodiments of the invention described below refer to an example in which the semiconductor switch circuit includes therein an SPnT radio frequency switch. However, the invention can be similarly practiced also in the case of including other types of switches, because the only difference is in the number of input-output terminals. Furthermore, in the following description, the switch element is an n-channel or p-channel MOSFET. However, other FETs such as HEMT (high electron mobility transistor) can also be used. Unless otherwise specified for conductivity type, MOSFETs of either conductivity type may be used.

First Embodiment

Figure 2A:
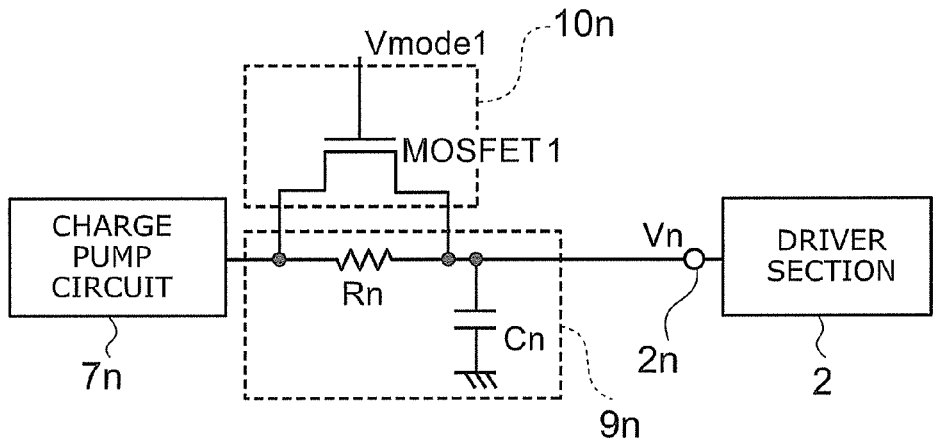
FIGS. 2A to 2C are block diagrams of part of the semiconductor switch circuit of the first embodiment.
Figure 2B:
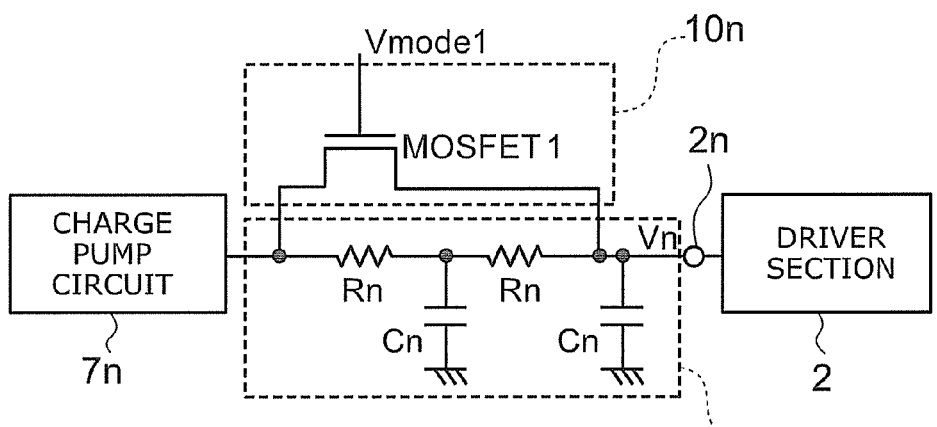
Figure 2C:
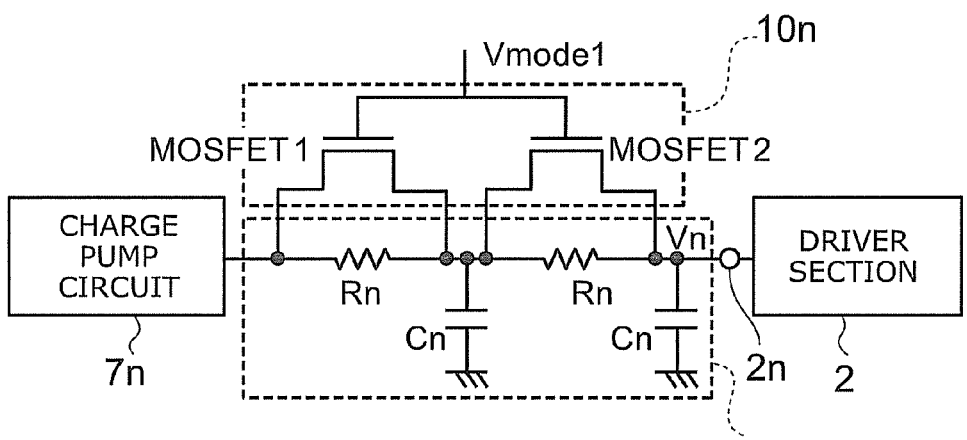
Figure 3:
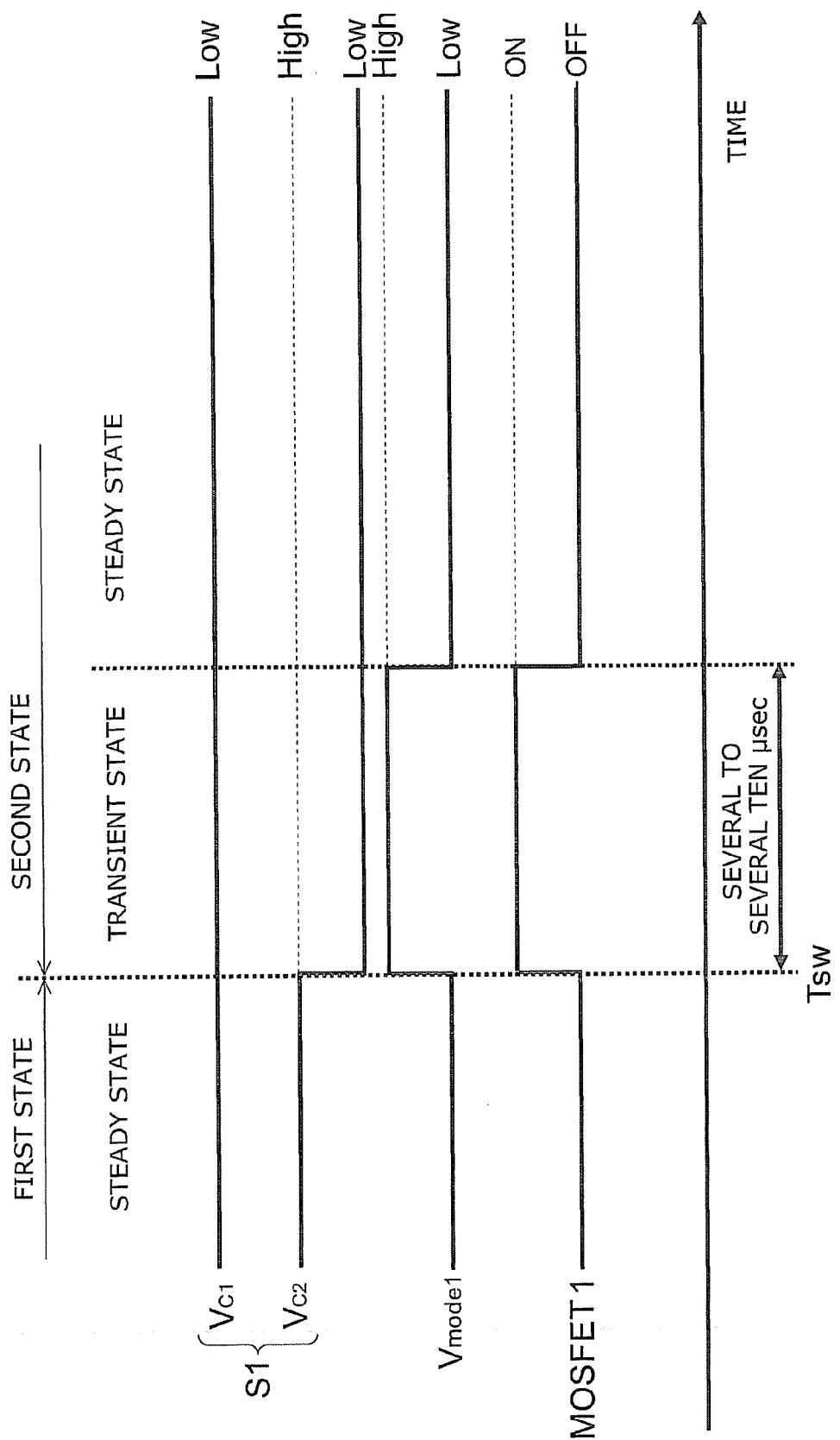
FIG. 3 shows a timing chart of signals of the semiconductor switch circuit of the first embodiment.

A semiconductor switch circuit 100 according to a first embodiment is described with reference to FIGS. 1 to 3. FIG. 1 is a block diagram of the semiconductor switch circuit of the first embodiment. FIGS. 2A to 2C are block diagrams of part of the semiconductor switch circuit of the first embodiment. FIG. 3 shows a timing chart of signals of the semiconductor switch circuit of the first embodiment.

As shown in FIG. 1, the semiconductor switch circuit 100 according to the first embodiment includes a switch section 1, a terminal switching control signal input terminal 4, a decoder section 3, a driver section 2, a DC-DC converter 5, a first filter circuit 9n, a first filter bypass circuit 10n, and a first bypass control circuit 11a. The switch section 1 is an SPnT semiconductor switch composed of one antenna terminal P (input-output terminal) and many radio frequency signal terminals T1-Tn. The antenna terminal P is connected to an antenna ANT. The radio frequency signal terminals T1-Tn are connected to transmit circuits and receive circuits, not shown. Between the antenna terminal P and each radio frequency signal terminal T1-Tn, a semiconductor switch element is formed from a MOSFET and the like. Connection or disconnection between the antenna terminal P and each radio frequency signal terminal T1-Tn is performed by turning on/off the semiconductor switch element. For use in mobile phones, for instance, at transmit time, the semiconductor element between the antenna terminal P and the radio frequency signal terminal (e.g. T1) connected to the transmit circuit is turned on, and the semiconductor switch elements between the antenna terminal and the other radio frequency signal terminals are turned off. At receive time, the semiconductor switch element between the antenna terminal P and the radio frequency signal terminal (e.g. T2) connected to the receive circuit is turned on, and the semiconductor switch elements between the antenna terminal P and the other radio frequency signal terminals are turned off. By switching the semiconductor switch element connected between the antenna terminal P and each radio frequency signal terminal T1-Tn, a particular circuit out of a plurality of transmit circuits and receive circuits is selected to be connected to the antenna.

A terminal switching control signal S1 for determining the ON/OFF state of the aforementioned semiconductor switch elements is inputted to the terminal switching control signal terminal 4. For simplicity of description, consider an example in which the switch section 1 is SP4T. Then, the terminal switching control signal terminal 4 is composed of two terminals. Two bits of input signals $V_{c1}$ and $V_{c2}$ are inputted to the terminal switching control signal terminal 4 of the semiconductor switch circuit 100. In this case, by combination of input signals $V_{c1}$ and $V_{c2}$ at a High level (hereinafter High) and a Low level (hereinafter Low), four ON/OFF switching combinations for the semiconductor switch elements can be coded. With the increase of radio frequency signal terminals, the number of bits of the input signals needs to be increased. Hence, the number of input terminals of the terminal switching control signal terminal needs to be increased to as many as the number of bits.

The decoder section 3 receives the terminal switching control signal S1 and sends a switch control signal S2 for controlling ON/OFF of each semiconductor switch element in the switch section 1 to the driver section 2 (for description taking SP4T as an example, it is assumed that the number of radio frequency signal terminals is four, and that the number of semiconductor switch elements is also four). The switch control signal S2 is a gate signal for turning on/off the gate of each semiconductor switch element. The switch control signal S2 is sent through a signal line corresponding to the gate electrode of each semiconductor switch element. In the case of SP4T, four signal lines are used to send the switch control signal S2 to the driver section 2.

The driver section 2 has therein a positive potential Vp and a negative potential Vn, which are externally supplied as described later (one of the potentials is a first potential, and the other is a second potential). In the description of the embodiment, as an example, the positive potential Vp is a potential for turning on the semiconductor switch element in the switch section 1. The negative potential Vn is a potential for turning off the semiconductor switch element. In the case where the semiconductor switch element in the switch section is a p-channel MOSFET, the foregoing is reversed. The driver section 2 sends a switch drive signal S3 to the switch section 1 through a plurality of signal lines connected to the gate electrodes thereof. The switch drive signal S3 is a potential for driving each semiconductor switch element in the switch section 1. The driver section 2 generates the switch drive signal S3 in accordance with the switch control signal sent from the decoder 2. The positive potential Vp is supplied to the signal line connected to the gate electrode of the semiconductor switch element to be turned on in the switch section 1. The negative potential Vn is supplied to the signal line connected to the gate electrode of the semiconductor switch element to be turned off.

The DC-DC converter 5 generates the positive potential Vp and the negative potential Vn. For simplicity of description, the embodiment is described with reference to an example in which the DC-DC converter 5 generates the negative potential Vn and supplies it to the driver section. The positive potential Vp can be similarly described except for reversing the polarity, and hence the description thereof is omitted. Depending on the design of the semiconductor switch circuit, the positive potential Vp can be generated by the DC-DC converter, and the ground potential can be used for the negative potential Vn.

The DC-DC converter 5 includes a ring oscillator circuit 6 and a charge pump circuit 7n. The ring oscillator circuit 6 generates two pulse signals inverted from each other and supplies them to the charge pump circuit 7n (first charge pump circuit). By using these two pulse signals, the charge pump circuit 7n steps up the power supply voltage $V_{dd}$ externally supplied from a power supply terminal 8 and converts it to a negative potential for output. This output potential is supplied as a negative potential Vn (first potential) from the output terminal (not shown) of the DC-DC converter 5 through a filter circuit (first filter circuit) 9n to the negative potential terminal 2n (first potential terminal) of the driver section 2. The filter circuit 9n is electrically connected in series between the DC-DC converter 5 and the driver section 2.

The filter circuit 9n is a low-pass filter including a filter resistor Rn and a filter capacitor Cn. The filter resistor Rn is electrically connected in series between the output terminal of the DC-DC converter 5 and the negative potential terminal 2n of the driver section 2. One end of the filter capacitor Cn is electrically connected to the driver section 2 side end of this filter resistor Rn. The other end of the filter capacitor Cn is grounded. The input terminal of the filter circuit 9n is one end of the filter resistor Rn on the DC-DC converter 5 side. The output terminal of the filter circuit 9n is the other end on the driver section 2 side. Here, the filter capacitor Cn can also act as a capacitor charged by the current outputted from the charge pump circuit 7n.

The filter bypass circuit 10n (first filter bypass circuit) is electrically connected in parallel with the filter circuit 9n. As an example, as shown in FIG. 2A, the drain electrode and the source electrode of a MOSFET are connected across the filter resistor Rn of the filter circuit 9n. When the gate electrode is applied with a gate voltage for turning on the MOSFET, the MOSFET is placed in the conduction state, and the filter circuit 9n is bypassed. Alternatively, the filter circuit 9n may be other than a single stage RC filter of the filter resistor Rn and the filter capacitor Cn. As shown in FIG. 2B or 2C, the filter circuit 9n may be a multi-stage RC filter of filter resistors Rn and filter capacitors Cn. In this case, as shown in FIG. 2B, the MOSFET of the filter bypass circuit 10n may be placed in parallel with the overall multi-stage RC filter. Alternatively, as shown in FIG. 2C, a MOSFET may be placed in parallel with each stage of the RC filter. In any case, when the filter bypass circuit 10n is in the conduction state, the filter circuit 9n is bypassed, and the filter capacitor Cn acts as a capacitor charged by the current outputted from the charge pump circuit 7n as described above.

The bypass control circuit 11a (first bypass control circuit) sends a mode signal $V_{mode1}$ (first mode signal) to the filter bypass circuit 10n so that when the bypass control circuit 11a senses the change of the terminal switching control signal S1, the filter bypass circuit 10n is placed in the conduction state for a predesigned fixed time. More specifically, the bypass control circuit 11a senses that the state of High and Low of the 2-bit terminal control signal S1 has changed. The bypass control circuit 11a is wired to the filter bypass circuit 10n so as to send, upon the sensing, a High signal to the filter bypass circuit 10n (to the gate electrode of the MOSFET in the case of the filter bypass circuits of FIGS. 2A to 2C) for a fixed time to place the filter bypass circuit 10n in the conduction state.

As described above, the semiconductor switch circuit 100 according to the embodiment is configured. In the following, the operation of the semiconductor switch circuit 100 according to the embodiment is briefly described with reference to the timing chart of signals in FIG. 3. A terminal switching control signal S1 is inputted to the terminal switching control signal terminal 4 of the semiconductor switch circuit 100. The terminal switching control signal S1 determines which radio frequency signal terminal is connected to the antenna terminal P and which radio frequency signal terminal is disconnected from the antenna terminal P (the switching state of the switch section). In the case of SP4T of the embodiment, as described above, the terminal switching control signal S1 is composed of two bits of input signals $V_{c1}$ and $V_{c2}$. The switch section 1 includes an antenna terminal P and four radio frequency signal terminals T1-T4. In the following description, it is assumed that the switching state of the switch section is switched from a first state to a second state. In the first state, the radio frequency signal terminal T1 is connected to the antenna terminal P, and the other radio frequency signal terminals are all disconnected. In the second state, the radio frequency signal terminal T2 is connected to the antenna terminal P, and the other radio frequency signal terminals are all disconnected. It is assumed that connection/disconnection between the antenna terminal and the radio frequency signal terminal is determined by ON/OFF of the semiconductor switch element connected therebetween (hereinafter briefly referred to as the semiconductor switch element of the radio frequency signal terminal).

In the first state, the input signal $V_{c1}$ of the terminal switching control signal S1 is Low, and the input signal $V_{c2}$ is High. The terminal switching control signal 51 has information for connecting the radio frequency signal terminal T1 to the antenna terminal P and disconnecting the other radio frequency signal terminals T2-T4. That is, the terminal switching control signal S1 has information for turning on the radio frequency signal terminal T1 and turning off the other radio frequency signal terminals T2-T4. The decoder section 3 receives this terminal switching control signal S1 and sends a switch control signal S2 to the driver section 2. The switch control signal S2 controls ON/OFF of the semiconductor switch element of each radio frequency signal terminal corresponding to the terminal switching control signal S1. That is, the terminal switching control signal S1 is a control signal for turning on the semiconductor switch element of the radio frequency signal terminal T1 and turning off the semiconductor switch elements of the other radio frequency signal terminals T2-T4. The output from the charge pump 7n in the DC-DC converter 5 is supplied as a negative potential Vn to the driver section 2 through the filter circuit 9n. In response to the switch control signal S2, the driver section 2 supplies a switch drive signal S3 to the switch section 1. The switch drive signal S3 is constituted by a driving voltage for turning on/off the semiconductor switch element of each radio frequency signal terminal. That is, the switch drive signal S3 is a signal of sending a positive potential Vp for turn-on to the gate electrode of the semiconductor switch element of the radio frequency signal terminal T1, and sending a negative potential Vn for turn-off to the gate electrode of each semiconductor switch element of the other radio frequency signal terminals T2-T4. Upon receiving this switch drive signal S3, the switch section 1 connects the radio frequency signal terminal T1 to the antenna terminal P and disconnects the other radio frequency signal terminals T2-T4 from the antenna terminal P.

Harmonic noise generated from the ring oscillator circuit in the DC-DC converter 5 may be included in the negative potential Vn supplied to the driver section 2. This harmonic noise may be included in the output from each radio frequency signal terminal through the switch section 1. To reduce harmonic noise in the output characteristics of the semiconductor switch circuit, a filter circuit 9n is provided in series between the output terminal of the DC-DC converter 5 and the negative potential input terminal of the driver section 2. As described above, this filter circuit 9n is a low-pass filter composed of a filter resistor Rn and a filter capacitor Cn. This low-pass filter reduces harmonic noise in the output characteristics of the semiconductor switch circuit 100.

Next, to switch the switch section 1 from the first state to the second state, at time $T_{sw}$, the terminal switching control signal S1 is changed as shown in FIG. 3. That is, only the input signal $V_{c2}$ is changed from High to Low. As described above, this signal changes the switch control signal S2 and the switch drive signal S3. Thus, in the switch section 1, the semiconductor switch element of the radio frequency signal terminal T1 is switched from ON to OFF, and the semiconductor switch element of the radio frequency signal terminal T2 is switched from OFF to ON. When the semiconductor switch element is switched from ON to OFF, holes are emitted from the gate electrode to the DC-DC converter 5 side through the negative potential terminal 2n of the driver section 2. Thus, the filter capacitor Cn of the filter circuit 9n discharges. This increases the negative potential Vn supplied to the driver section 2 (decreases the absolute value of the negative potential Vn). As the absolute value of the negative potential decreases, a current flows from the DC-DC converter 5 side and charges the filter capacitor Cn until the voltage reaches the steady value of the output voltage on the DC-DC converter 5 side. While the absolute value of the negative potential Vn does not reach a prescribed value, the semiconductor switch element in the switch section 1 is not sufficiently disconnected. This causes off-distortion in the output characteristics of the semiconductor switch circuit 100. Furthermore, although the description has been omitted, a positive potential Vp can be supplied from the DC-DC converter 5 to the driver section 2 (in the following, the reference numerals of the fourth embodiment described later are used as the reference numerals of the corresponding components). In this case, when the semiconductor switch element is switched from OFF to ON, the gate electrode of the semiconductor switch element is charged with holes from the DC-DC converter 5 side through the positive potential terminal 2p of the driver section 2. Thus, the filter capacitor Cp of the filter circuit 9p discharges. This decreases the positive potential Vp supplied to the driver section 2 (decreases the absolute value of the positive potential Vp). While the absolute value of the positive potential Vp does not reach a prescribed value, the semiconductor switch element is not sufficiently turned on. This causes on-distortion in the output characteristics. Hence, immediately after switching of the switch until recovering to a prescribed potential, the negative potential Vn and the positive potential Vp are both in the transient state of switching, and good output characteristics are not achieved. After the transient state, a steady state as a second state occurs, and good output characteristics are stably achieved. In the semiconductor switch circuit, the response of the switch becomes poorer as the transient state of switching becomes longer.

Charging/discharging of the filter capacitor Cn of the aforementioned filter circuit 9n is determined by the time constant, which is the product of the filter resistance Rn and the filter capacitance Cn of the filter circuit 9n. Hence, the presence of the filter circuit 9n impairs the recovery response of the negative potential Vn. That is, the filter circuit 9n impairs the switching response in exchange for being able to reduce harmonic noise in the output characteristics. Thus, in the semiconductor switch circuit 100 of the embodiment, a mode signal $V_{mode1}$ is sent from the filter bypass control circuit 11a to the filter bypass circuit 10n so that when switching of the switch section 1 occurs, the filter bypass circuit 10n is placed in the conduction state for a prescribed time. The mode signal $V_{mode1}$ is set to High for a prescribed time immediately after switching of the switch section 1. Thus, the MOSFET in the filter bypass circuit 10n is turned on for a prescribed time. As a result, for a prescribed time immediately after switching of the switch section 1, the filter resistor Rn of the filter circuit 9n is bypassed, and the filter capacitor Cn is rapidly charged. Hence, the absolute value of the negative potential recovers rapidly. That is, the response of the semiconductor switch circuit 100 is improved. Here, during this prescribed time, the filter circuit 9n is bypassed, and hence harmonic noise occurs in the output characteristics of the semiconductor switch circuit 100. However, this is limited to during the transient state of the switching and does not cause any problem in use. This prescribed time can be set to the time period elapsed until the negative potential Vn recovers to the steady value.

The bypass control circuit 11a of the semiconductor switch circuit 100 senses switching of the switch section 1 by the change of the terminal switching control signal S1. The bypass control circuit 11a sends the mode signal $V_{mode1}$ to the filter bypass circuit so that when the terminal switching control signal S1 has changed, the filter bypass circuit 10n is placed in the conduction state. Sensing the change of the terminal switching control signal S1 having fewer signal lines is easier than sensing switching in the switch section 1. Sensing the change in the switch control signal S2 or the switch drive signal S3 is also easier than sensing switching in the switch section 1. However, sensing the change in these signals is slightly disadvantageous because more signal lines are involved than sensing in the terminal switching control signal S1.

As described above, in the semiconductor switch circuit 100 according to the embodiment, a filter bypass circuit 10n is electrically connected in parallel with the filter circuit 9n. A negative potential Vn (first potential) is supplied from the DC-DC converter 5 through the filter circuit 9n to the driver section 2. Thus, in the steady state, the semiconductor switch circuit 100 has output characteristics in which harmonic noise from the DC-DC converter is reduced. The bypass control circuit 11a is configured to send a mode signal $V_{mode1}$ to the filter bypass circuit 10n so that when switching of the switch section 1 occurs, the filter bypass circuit 10n is placed in the conduction state. Thus, when the switch section 1 is switched, the filter circuit 9n is bypassed. Hence, the semiconductor switch circuit 100 is superior in switching response. In particular, in the semiconductor switch circuit 100, the bypass control circuit 11a senses the change of the terminal switching control signal to determine that the switch section is switched. This simplifies the wiring structure. Thus, in the semiconductor switch circuit 100, harmonic noise in the output characteristics is reduced, and good switching response is achieved.

In the example used in the description of the embodiment, in the semiconductor switch circuit 100, the DC-DC converter 5 supplies a negative potential Vn to the driver section 2. However, the case of supplying a positive potential Vp is similarly configured. Consider the case where a positive potential Vp (second potential) is generated (this case is described using the reference numerals of the fourth embodiment described later in which the positive potential Vp is supplied). In this case, another charge pump circuit 7p (second charge pump circuit) similarly steps up the power supply voltage $V_{dd}$ externally supplied from the power supply terminal 8 and outputs it as a positive potential. This output potential is supplied as a positive potential Vp (second potential) through a filter circuit (second filter circuit) 9p to the positive potential terminal 2p (second potential terminal), not shown, of the driver section 2. The filter circuit 9p is electrically connected in series between the DC-DC converter 5 and the driver section 2. A filter bypass circuit 10p (second filter bypass circuit) is electrically connected in parallel with the filter circuit 9p. The bypass control circuit 11a (second bypass control circuit) sends a mode signal $V_{mode2}$ (second mode signal) to the filter bypass circuit 10p so that when the bypass control circuit 11a senses the change of the terminal switching control signal S1, the filter bypass circuit 10p is placed in the conduction state. The function and effect of each circuit in the case of supplying the positive potential Vp are similar to those in the case of supplying the negative potential Vn. Here, the embodiment is not limited to supplying either the positive potential Vp or the negative potential Vn from the DC-DC converter to the driver section. It is understood that the embodiment of supplying both the positive potential Vp and the negative potential Vn is also possible. In this case, as described above, the configuration of the charge pump circuit, filter circuit, filter bypass circuit, and bypass control circuit for supplying each of the positive potential Vp and the negative potential Vn can be provided in the semiconductor switch circuit 100.

Second Embodiment

Figure 4:
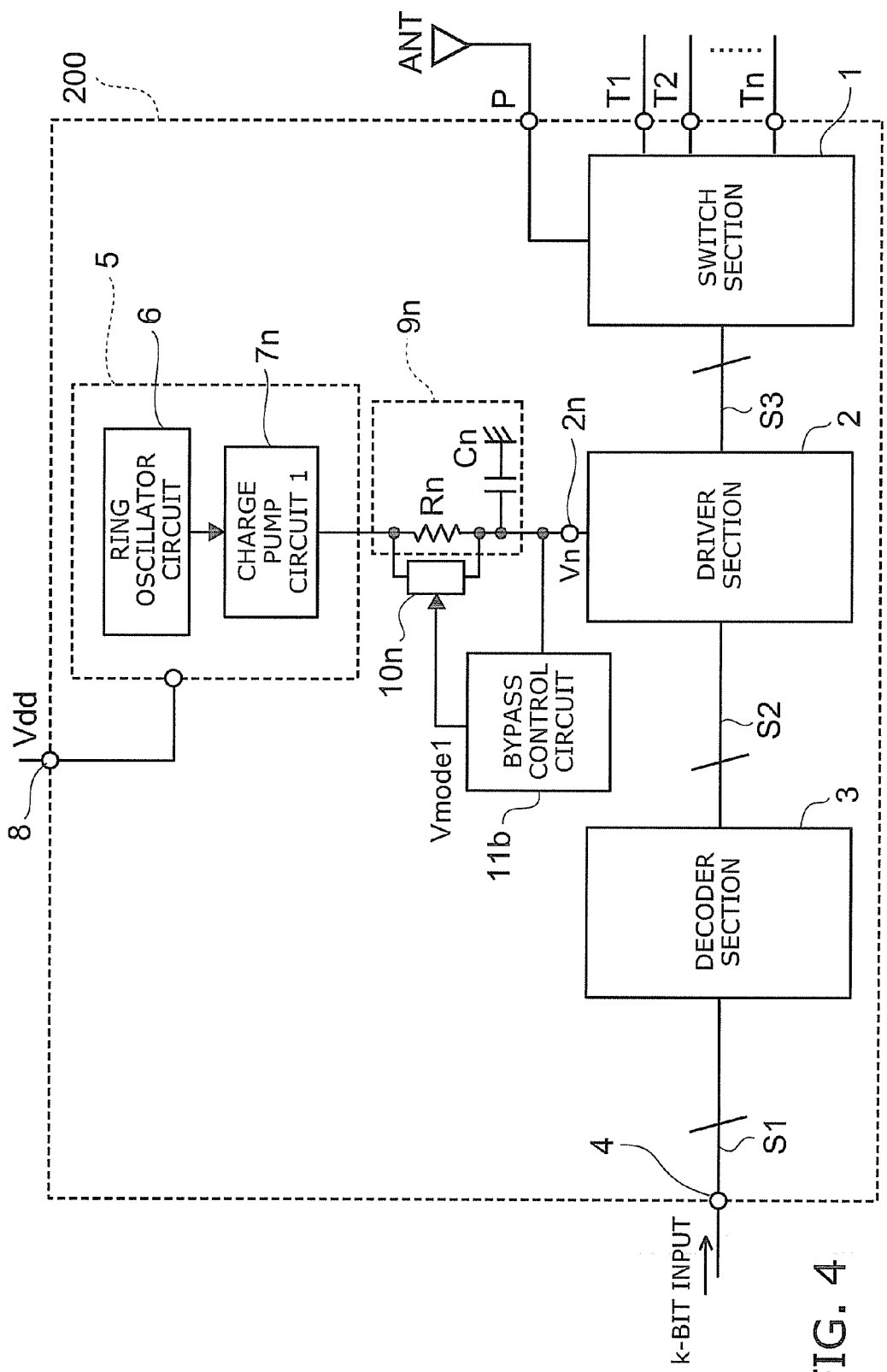
FIG. 4 is a block diagram of a semiconductor switch circuit of a second embodiment.
Figure 5:
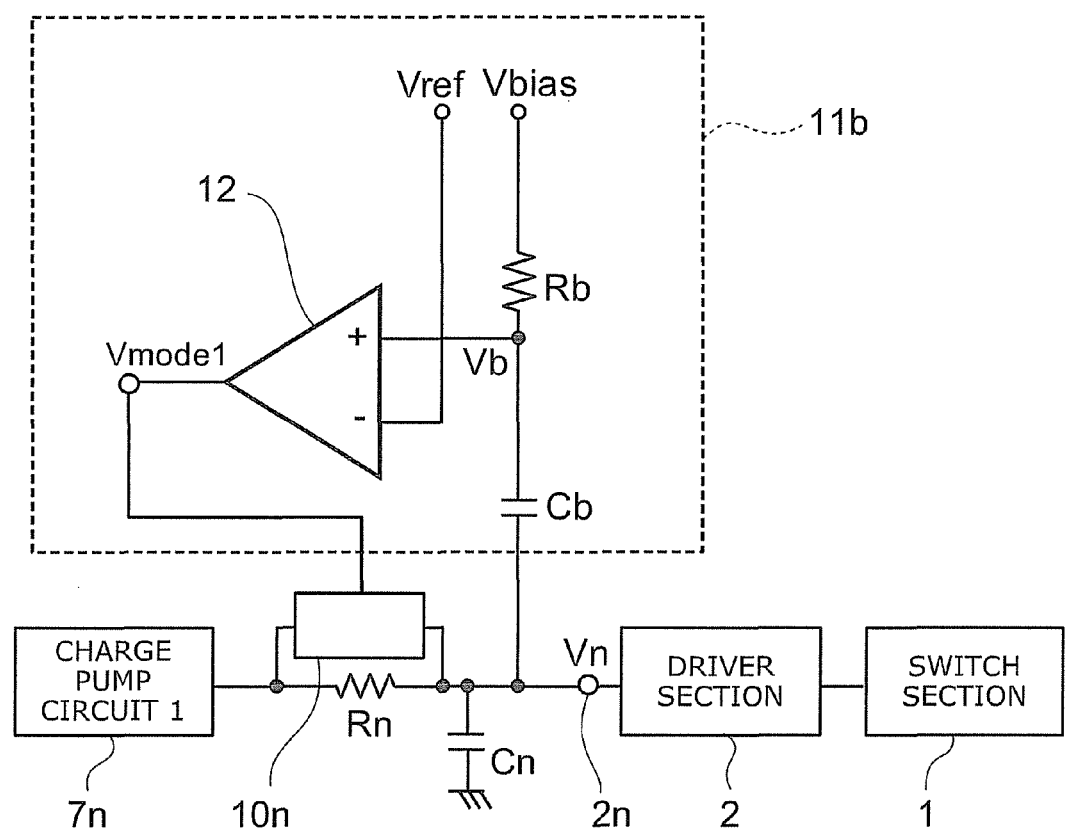
FIG. 5 is a block diagram of part of the semiconductor switch circuit of the second embodiment.
Figure 6:
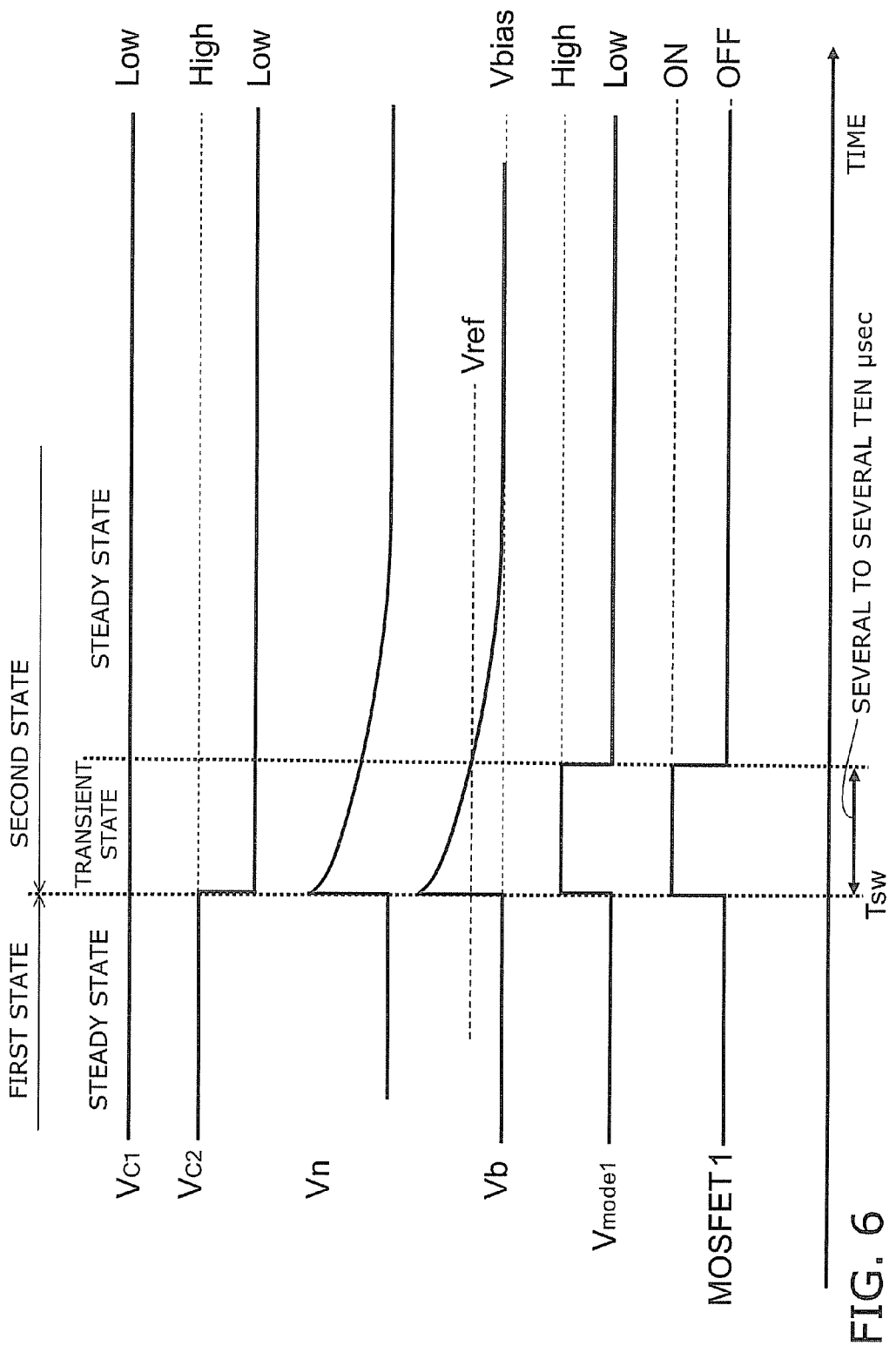
FIG. 6 shows a timing chart of the semiconductor switch circuit of the second embodiment.

A semiconductor switch circuit 200 according to a second embodiment is described with reference to FIGS. 4 to 6. FIG. 4 is a block diagram of the semiconductor switch circuit of the second embodiment. FIG. 5 is a block diagram of part of the semiconductor switch circuit of the second embodiment. FIG. 6 shows a timing chart of the semiconductor switch circuit of the second embodiment. Here, the components having the same configuration as those described in the first embodiment are labeled with like reference numerals or symbols, and the description thereof is omitted. Differences from the first embodiment are mainly described.

Like the semiconductor switch circuit 100 according to the first embodiment, in the configuration of the semiconductor switch circuit 200 according to the embodiment, the DC-DC converter 5 supplies a negative potential Vn through a filter circuit 9n to the driver section 2. A filter bypass circuit 10n is electrically connected in parallel with the filter circuit 9n. The bypass control circuit 11b is configured to send the mode signal $V_{mode1}$ to the filter bypass circuit 10n so that when switching of the switch section 1 occurs, the filter bypass circuit 10n is placed in the conduction state. The same also applies to the case where the DC-DC converter 5 supplies a positive potential Vp to the driver section 2 when the switch section 1 is switched, and hence the description thereof is omitted also in the embodiment. The following description focuses on differences from the semiconductor switch circuit 100 according to the first embodiment.

In the semiconductor switch circuit 100 according to the first embodiment, the bypass control circuit 11a senses the change of the terminal switching control signal S1 to determine that the switch section 1 is switched. Then, the bypass control circuit 11a sends the mode signal $V_{mode1}$ to the filter bypass circuit 10n. In contrast, in the semiconductor switch circuit 200 of the embodiment, the bypass control circuit 11b senses that the absolute value of the potential of the negative potential Vn supplied to the driver section 2 has decreased. Thus, the bypass control circuit 11b determines that the switch section 1 is switched. Then, the bypass control circuit 11b sends the mode signal $V_{mode1}$ to the filter bypass circuit 10n. The semiconductor switch circuit 200 according to the embodiment is different in this point from the semiconductor switch circuit 100 according to the first embodiment.

In the case where switching of the switch section 1 occurs, as described above, when the semiconductor switch element in the switch section 1 is switched from ON to OFF, holes are emitted from the gate electrode to the DC-DC converter 5 side through the negative potential terminal 2n of the driver section 2. Thus, the filter capacitor Cn of the filter circuit 9n discharges. This decreases the absolute value of the negative potential Vn supplied to the driver section 2. In the semiconductor switch circuit 200 according to the embodiment, the mode signal $V_{mode1}$ is sent to the filter bypass circuit 10n so that when the bypass control circuit 11b senses the decrease of the absolute value of the negative potential Vn supplied to the driver section 2, the filter bypass circuit 10n is placed in the conduction state.

FIG. 5 shows an example of the bypass control circuit 11b of the semiconductor switch circuit 200. The bypass control circuit 11b includes a bias resistor Rb, a bias capacitor Cb, and a comparison circuit 12. One end of the bias capacitor Cb is electrically connected to the negative potential terminal 2n (first potential terminal) of the driver section 2. The other end of the bias capacitor Cb is electrically connected to one end of the bias resistor Rb. The other end of the bias resistor Rb is electrically connected to a bias power supply and supplied with a bias voltage $V_{bias}$. The junction point of the bias resistor Rb and the bias capacitor Cb is electrically connected to the non-inverting terminal of the comparison circuit 12. That is, the potential Vb of the junction point of the bias resistor Rb and the bias capacitor Cb is supplied to the non-inverting terminal of the comparison circuit. The inverting terminal of the comparison circuit 12 is applied with a reference potential $V_{ref}$. The output of the comparison circuit 12 is supplied as a mode signal $V_{mode1}$ to the filter bypass circuit 10n.

The operation of the semiconductor switch circuit 200 is described with reference to the timing chart shown in FIG. 6. As in the first embodiment, the operation is described using an SP4T switch circuit as an example. When the switch section 1 is switched from the first state to the second state (at time $T_{sw}$%), as described above, the negative potential Vn supplied to the driver section 2 instantaneously increases (the absolute value decreases), and then gradually decreases (the absolute value increases). Due to this increase of the negative potential Vn, the potential Vb at the junction point of the bias resistor Rb and the bias capacitor Cb instantaneously increases from the bias potential $V_{bias}$ of the first state. Then, the potential Vb decreases in accordance with the time constant, which is the product of the bias resistance Rb and the bias capacitance Cb. The potential Vb converges to the bias potential $V_{bias}$ and is placed in the steady state of the second state. The comparison circuit 12 outputs a High signal only while the potential Vb at the aforementioned junction point is higher than the reference potential $V_{ref}$ (the transient state at switching time). Otherwise, in the steady state, the comparison circuit 12 outputs Low. The bypass control circuit 11b uses this output of the comparison circuit 12 as a mode signal $V_{mode1}$ for output to the filter bypass circuit 10n. By changing the value of the reference potential $V_{ref}$ or the time constant, which is the product of the bias resistance Rb and the bias capacitance Cb, the time for which the mode signal $V_{mode1}$ is High can be adjusted. Only during the transient state at switching time when $V_{mode1}$ is High, the filter bypass circuit 10n is placed in the conduction state, and the filter circuit 9n is bypassed.

Also in the semiconductor switch circuit 200 according to the embodiment, a filter bypass circuit 10n is electrically connected in parallel with the filter circuit 9n. A negative potential Vn (first potential) is supplied from the DC-DC converter 5 through the filter circuit 9n to the driver section 2. Thus, in the steady state, the semiconductor switch circuit 200 has output characteristics in which harmonic noise from the DC-DC converter 5 is reduced. The bypass control circuit 11b is configured to send a mode signal to the filter bypass circuit 10n so that when switching of the switch section 1 occurs, the filter bypass circuit 10n is placed in the conduction state. Thus, when the switch section 1 is switched, the filter circuit 9n is bypassed. Hence, the semiconductor switch circuit 200 is superior in switching response. Like the semiconductor switch circuit 100 according to the first embodiment, in the semiconductor switch circuit 200, harmonic noise in the output characteristics is reduced, and good switching response is achieved.

In particular, in the semiconductor switch circuit 200, the bypass control circuit 11b senses that the absolute value of the potential of the negative potential Vn (the potential of the negative potential terminal) supplied to the driver section 2 has decreased. Thus, the bypass control circuit 11b determines that the switch section 1 is switched. Then, the bypass control circuit 11b sends the mode signal $V_{mode1}$ to the filter bypass circuit 10n so that the filter bypass circuit 10n is placed in the conduction state. In the semiconductor switch circuit 200, the time for which the mode signal $V_{mode1}$ is High is adjusted in accordance with the amount of change of the negative potential Vn from the steady value due to switching of the switch section 1. Here, the negative potential Vn is supplied from the DC-DC converter 5 to the driver section 2.

Thus, advantageously, the switching control time is automatically set shorter than in the semiconductor switch circuit 100 according to the first embodiment.

As in the first embodiment, the aforementioned configuration for supplying the negative potential Vn from the DC-DC converter 5 to the driver section 2 can be practiced also in the case of supplying a positive potential Vp from the DC-DC converter 5 to the driver section 2.

Third Embodiment

Figure 7:
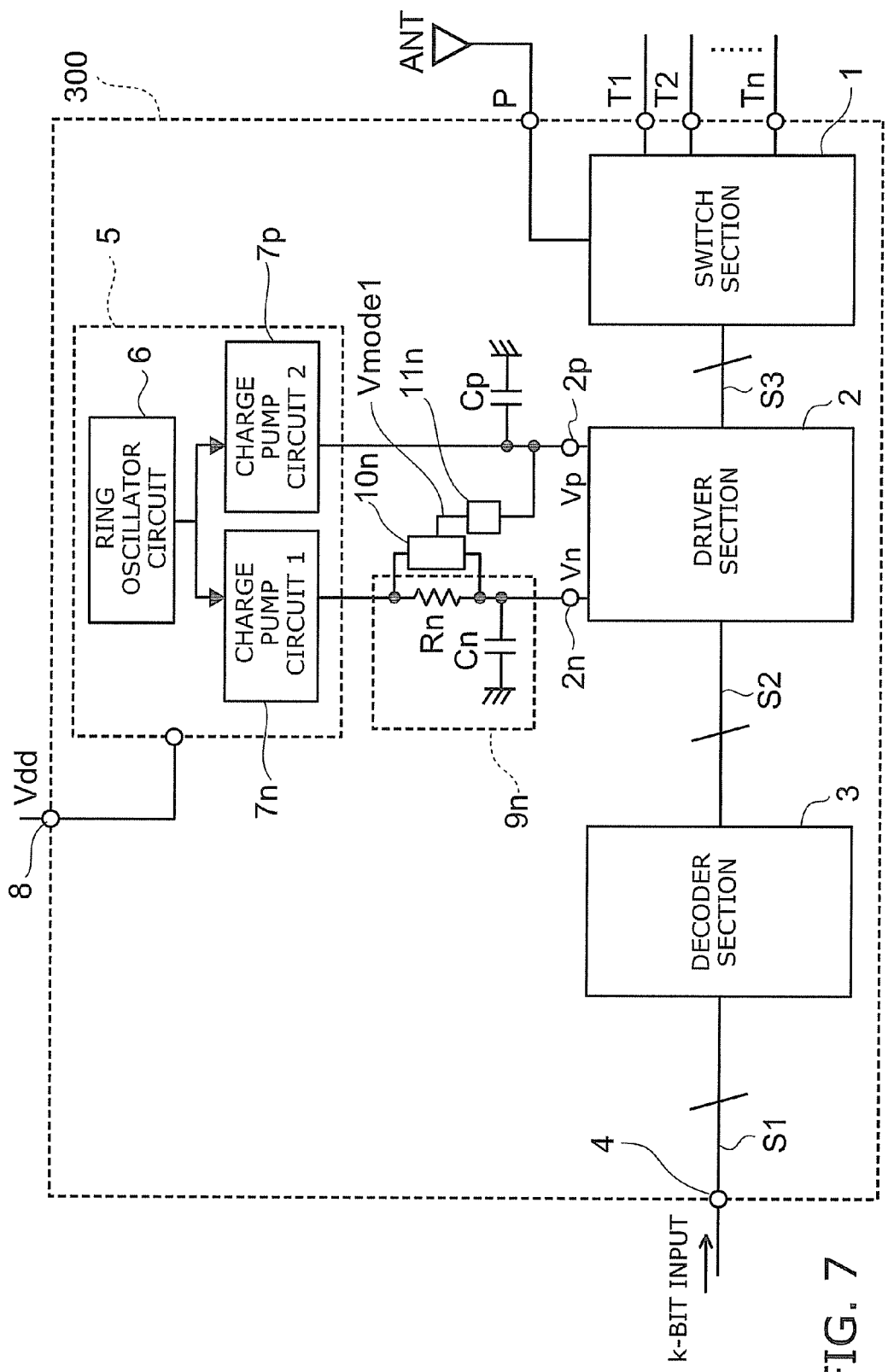
FIG. 7 is a block diagram of a semiconductor switch circuit of a third embodiment.
Figure 8:
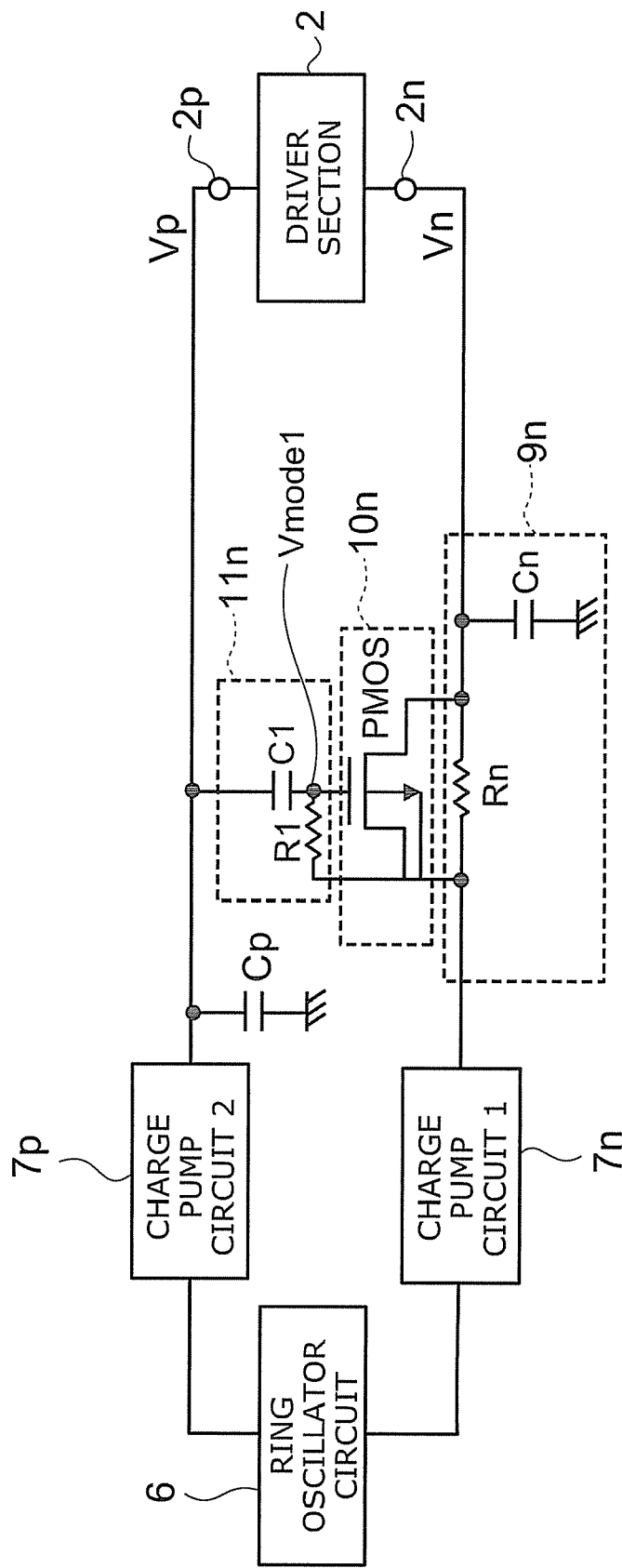
FIG. 8 is a block diagram of part of the semiconductor switch circuit of the third embodiment.
Figure 9:
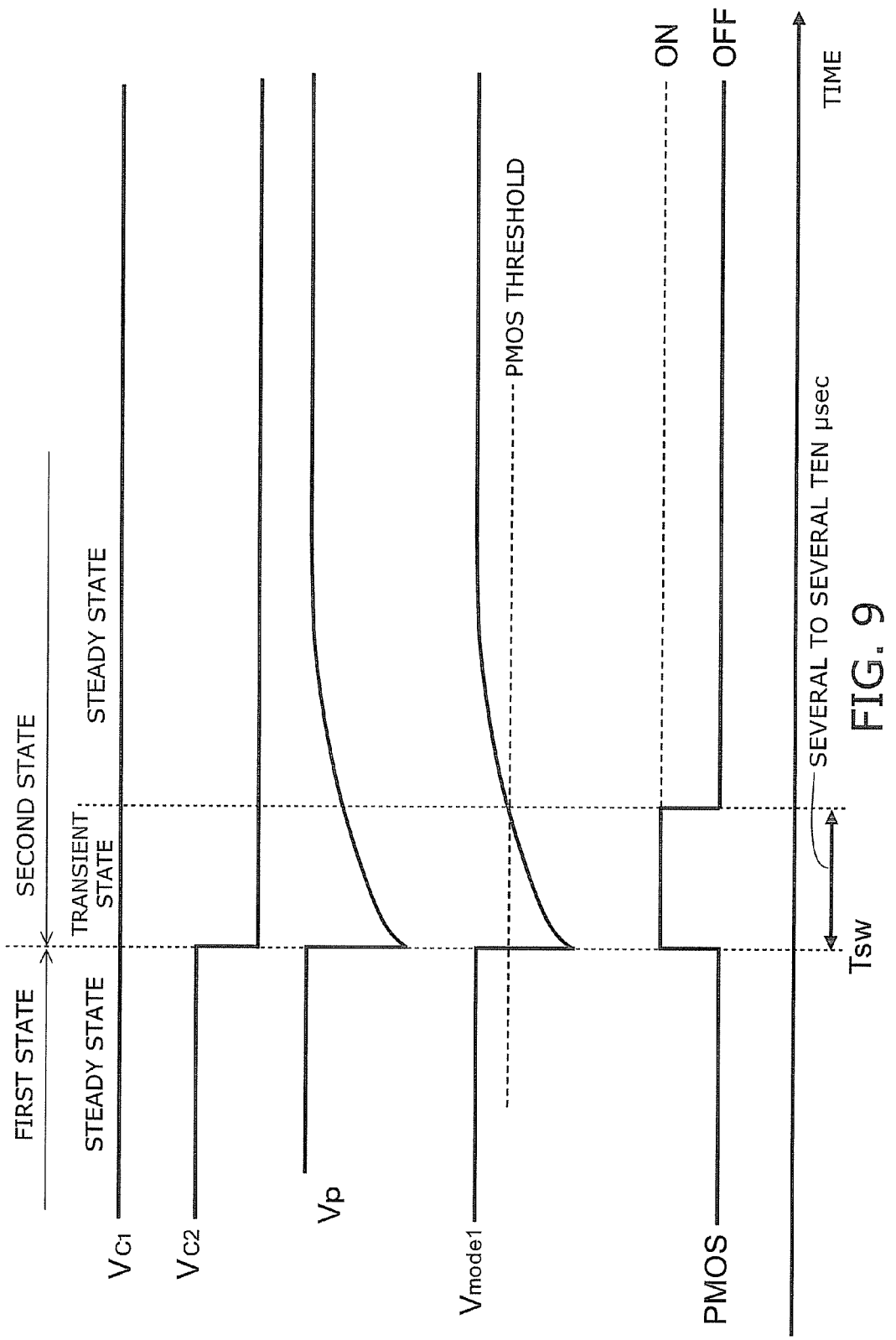
FIG. 9 shows a timing chart of the semiconductor switch circuit of the third embodiment.

A semiconductor switch circuit 300 according to a third embodiment is described with reference to FIGS. 7 to 9. FIG. 7 is a block diagram of the semiconductor switch circuit of the third embodiment. FIG. 8 is a block diagram of part of the semiconductor switch circuit of the third embodiment. FIG. 9 shows a timing chart of the semiconductor switch circuit of the third embodiment. Here, the components having the same configuration as those described in the first embodiment are labeled with like reference numerals or symbols, and the description thereof is omitted. Differences from the first embodiment are mainly described.

As shown in FIG. 7, like the semiconductor switch circuit 100 according to the first embodiment, in the configuration of the semiconductor switch circuit 300 according to the embodiment, the DC-DC converter 5 supplies a negative potential Vn (first potential) through a first filter circuit 9n to the driver section 2. A first filter bypass circuit 10n is electrically connected in parallel with the first filter circuit 9n. The negative potential Vn is supplied as the output of a first charge pump circuit 7n in the DC-DC converter 5. The first filter circuit 9n is a low-pass filter including a first filter resistor Rn and a first filter capacitor Cn. The first filter resistor Rn is electrically connected in series between the output terminal of the first charge pump circuit 7n in the DC-DC converter 5 and the negative potential terminal 2n (first potential terminal) of the driver section 2. One end of the first filter capacitor Cn is electrically connected to the driver section 2 side end of this first filter resistor Rn. The other end of the first filter capacitor Cn is grounded. The input terminal of the filter circuit 9n is one end of the first filter resistor Rn on the DC-DC converter 5 side. The output terminal of the filter circuit 9n is the other end on the driver section 2 side. Here, the first filter capacitor Cn can also act as a capacitor charged by the current outputted from the first charge pump circuit 7n. The first bypass control circuit 11n is configured to send a first mode signal to the first filter bypass circuit 10n so that when switching of the switch section 1 occurs, the first filter bypass circuit 10n is placed in the conduction state.

Furthermore, the semiconductor switch circuit 300 is configured so that the DC-DC converter 5 supplies a positive potential Vp (second potential) to the driver section 2 through the positive potential terminal 2p (second potential terminal) of the driver section 2. The positive potential Vp is supplied as the output of a second charge pump circuit 7p in the DC-DC converter 5. The semiconductor switch circuit 300 includes a second filter capacitor Cp. One end of the second filter capacitor Cp is electrically connected to the positive potential terminal 2p of the driver section 2. The other end of the second filter capacitor Cp is grounded. This second filter capacitor Cp acts as a capacitor charged by the current outputted from the second charge pump circuit 7p (as described later, the second filter capacitor Cp can also be used as a filter capacitor of a low-pass filter). The input terminal (not shown) of the first bypass control circuit 11n is electrically connected to the positive potential terminal 2p. The positive potential Vp is supplied as an input signal of the first bypass control circuit 11n. Here, as described above, a ring oscillator circuit 6 supplies two pulse signals inverted from each other to both the first charge pump circuit 7n and the second charge pump circuit 7p in order to step-up the power supply voltage Vdd to generate an output voltage.

In the semiconductor switch circuit 100 according to the first embodiment, the bypass control circuit 11a senses the change of the terminal switching control signal S1 to determine that the switch section 1 is switched. Then, the bypass control circuit 11a sends the mode signal $V_{mode1}$ to the filter bypass circuit 10n. In contrast, in the semiconductor switch circuit 300 according to the embodiment, the bypass control circuit 11n senses that the absolute value of the potential of the positive potential Vp (the potential of the positive potential terminal) supplied to the driver section 2 has decreased. Thus, the bypass control circuit 11n determines that the switch section 1 is switched. Then, the bypass control circuit 11n sends the mode signal $V_{mode1}$ to the filter bypass circuit 10n so that the filter bypass circuit 10n is placed in the conduction state. The semiconductor switch circuit 300 according to the embodiment is different in this point from the semiconductor switch circuit 100 according to the first embodiment.

In the case where switching of the switch section 1 occurs, as described above, when the semiconductor switch element in the switch section 1 is switched from ON to OFF, holes are emitted from the gate electrode to the DC-DC converter 5 side through the negative potential terminal 2n of the driver section 2. Thus, the first filter capacitor Cn of the first filter circuit 9n discharges. This increases the negative potential Vn supplied to the driver section 2, and decreases its absolute value. At the same time, in the semiconductor switch element of the switch section 1 switched from OFF to ON, the gate electrode is rapidly charged with holes from the DC-DC converter 5 side through the positive potential terminal 2p of the driver section 2. Thus, the second filter capacitor Cp connected to the positive potential terminal 2p discharges. This decreases the positive potential Vp supplied to the driver section 2 and decreases its absolute value. In the semiconductor switch circuit 300 according to the embodiment, the first mode signal $V_{mode1}$ is sent to the first filter bypass circuit 10n so that when the first bypass control circuit 11n senses the decrease of the absolute value of the positive potential Vp supplied to the driver section 2, the first filter bypass circuit 10n is placed in the conduction state.

FIG. 8 shows an example of the first bypass control circuit 11n and the first filter bypass circuit 10n of the semiconductor switch circuit 300. The first bypass control circuit 11n includes a first resistor R1 and a first capacitor C1. One end of the first capacitor C1 is electrically connected to the positive potential terminal 2p of the driver section 2. The other end of the first capacitor C1 is electrically connected to one end of the first resistor R1. The other end of the first resistor R1 is electrically connected to the input terminal of the first filter circuit. Here, the other end of the first resistor R1 may be connected to the output terminal of the first filter circuit. The potential of the junction point of the first capacitor C1 and the first resistor R1 is sent to the first filter bypass circuit 10n as a first mode signal $V_{mode1}$ for placing the first filter bypass circuit 10n in the conduction state.

The first filter bypass circuit includes a p-channel MOSFET with the source terminal and the drain terminal electrically connected to the input terminal and the output terminal of the first filter circuit 9n, respectively. The gate electrode of the p-channel MOSFET is supplied with the first mode signal $V_{mode1}$ of the first bypass control circuit 11n.

The operation of the semiconductor switch circuit 300 is described with reference to the timing chart shown in FIG. 9. As in the first embodiment, the operation is described with reference to an example in which the switch section 1 is SP4T. When the switch section 1 is switched from the first state to the second state (at time $T_{sw}$), as described above, the positive potential Vp supplied to the driver section 2 instantaneously decreases (the absolute value decreases), and then recovers to the original steady value of the positive potential Vp (transient state). The potential (denoted by $V_{mode1}$ in FIG. 9) of the junction point of the first capacitor C1 and the first resistor R1 also instantaneously decreases like the positive potential Vp, and recovers to the steady value in accordance with the time constant, which is the product of the first capacitance and the first resistance. Here, while the potential of the junction point of the first capacitor C1 and the first resistor R1 exceeds the threshold of the p-channel MOSFET of the first filter bypass circuit 10n, the first filter bypass circuit 10n is placed in the conduction state, as in the state of the mode signal $V_{mode1}$ being High in the above embodiments. This period is in the transient state at switching time. By bypassing the filter, the negative potential Vn can rapidly recover to the steady value. The time for which the first filter bypass circuit 10n is placed in the conduction state can be set by the time constant determined by the first resistance R1 and the first capacitance C1, or by the threshold of the p-channel MOSFET.

In each steady state of the first state and the second state before and after the transient state due to switching, the potential of the junction point of the first capacitor C1 and the first resistor R1 does not reach the threshold of the p-channel MOSFET of the first filter bypass circuit 10n. Thus, as in the case where the mode signal $V_{mode1}$ is Low in the first and second embodiment, the first filter bypass circuit 10n is placed in the non-conduction state. In this state, the negative potential Vn is supplied to the driver section 2 through the first filter. Hence, harmonic noise in the output characteristics is reduced.

As described above, in the semiconductor switch circuit 300 according to the embodiment, the potential of the junction point of the first capacitor C1 and the first resistor R1 serves as a first mode signal $V_{mode1}$ for placing the first filter bypass circuit 10n in the conduction state when switching of the switch section 1 occurs.

Also in the semiconductor switch circuit 300 according to the embodiment, a first filter bypass circuit 10n is electrically connected in parallel with the first filter circuit 9n. A negative potential Vn (first potential) is supplied from the DC-DC converter 5 through the first filter circuit 9n to the driver section 2. Thus, in the steady state, the semiconductor switch circuit 300 has output characteristics in which harmonic noise from the DC-DC converter 5 is reduced. The first bypass control circuit 11n is configured to send a first mode signal $V_{mode1}$ to the filter bypass circuit 10n so that when switching of the switch section 1 occurs, the first filter bypass circuit 10n is placed in the conduction state. Thus, when the switch section 1 is switched, the first filter circuit 9n is bypassed. Hence, the semiconductor switch circuit 300 is superior in switching response. Like the semiconductor switch circuit 100 according to the first embodiment, in the semiconductor switch circuit 300, harmonic noise in the output characteristics is reduced, and good switching response is achieved.

In particular, in the semiconductor switch circuit 300, the first bypass control circuit 11n senses that the absolute value of the potential of the positive potential Vp (the potential of the positive potential terminal) supplied to the driver section 2 has decreased. Thus, the first bypass control circuit 11n determines that the switch section 1 is switched. Then, the first bypass control circuit 11n sends the first mode signal $V_{mode1}$ to the first filter bypass circuit 10n so that the first filter bypass circuit 10n is placed in the conduction state. In the semiconductor switch circuit 300, the time for which the mode signal $V_{mode1}$ is High (the potential of the junction point of the first capacitor C1 and the first resistor R1 exceeds the threshold of the p-channel MOSFET) is adjusted in accordance with the amount of change of the positive potential Vp from the steady value due to switching of the switch section 1. Here, the positive potential Vp is supplied from the DC-DC converter 5 to the driver section 2. Thus, advantageously, in the semiconductor switch circuit 300 according to the embodiment, the switching control time is automatically set shorter than in the semiconductor switch circuit 100 according to the first embodiment.

Fourth Embodiment

Figure 10:
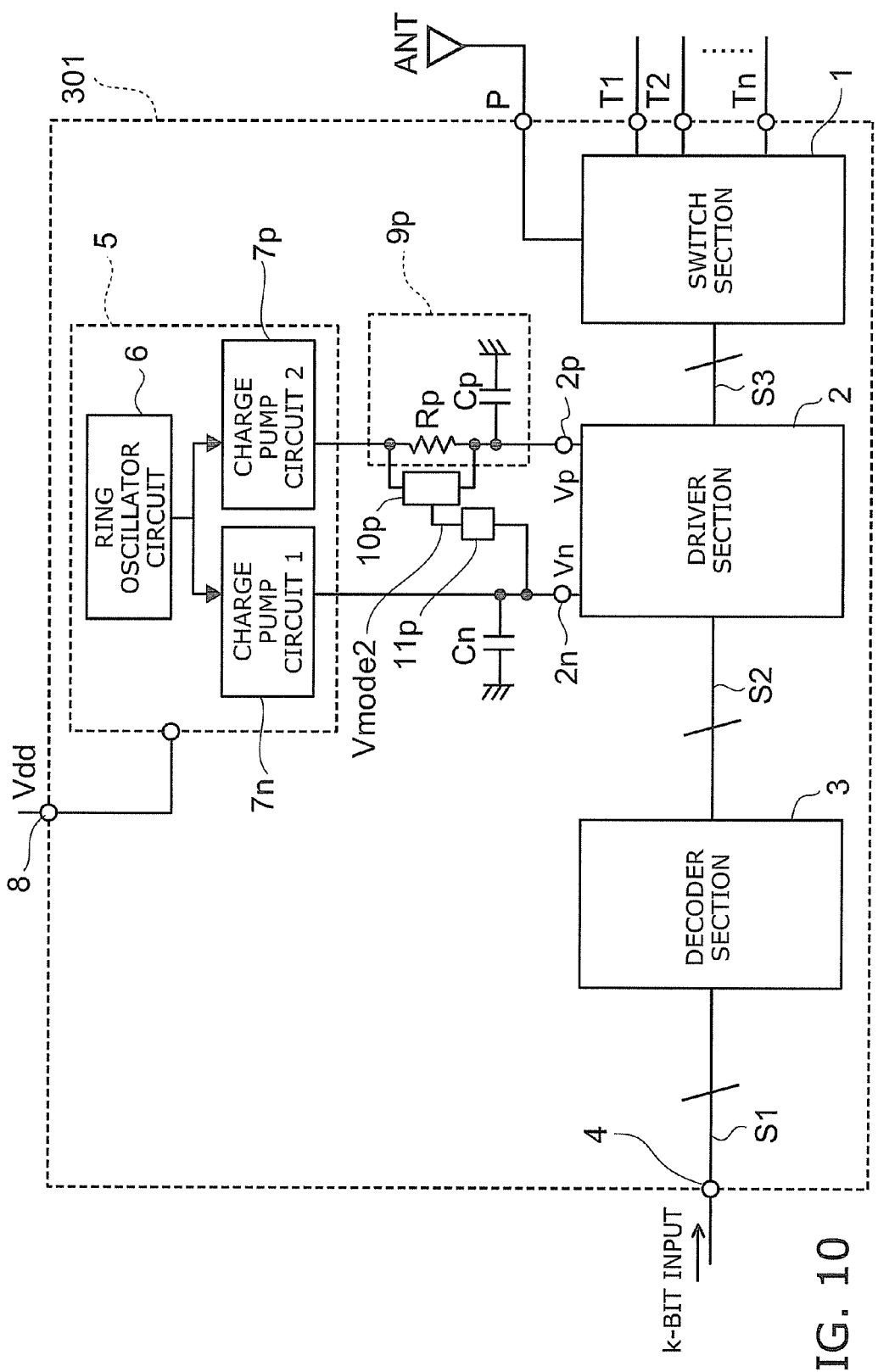
FIG. 10 is a block diagram of a semiconductor switch circuit of a fourth embodiment.
Figure 11:
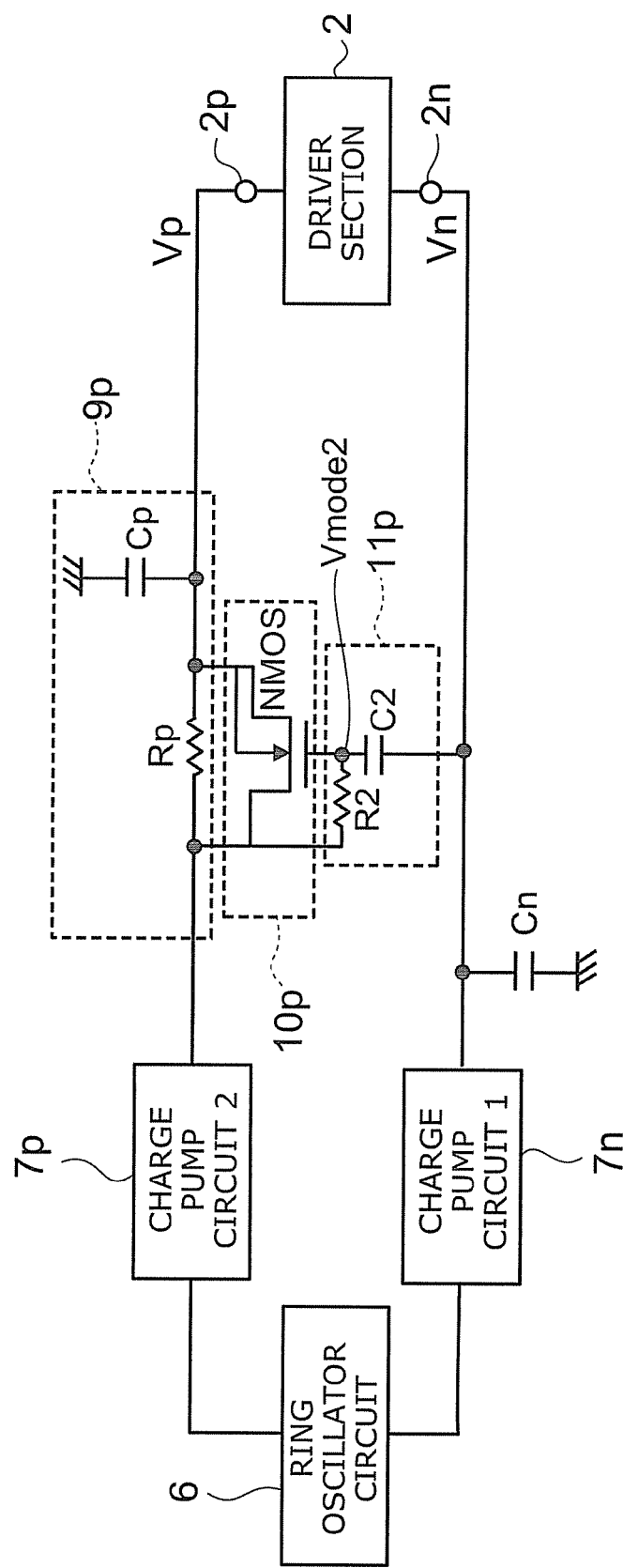
FIG. 11 is a block diagram of part of the semiconductor switch circuit of the fourth embodiment.

A semiconductor switch circuit 301 according to a fourth embodiment is described with reference to FIGS. 10 and 11. FIG. 10 is a block diagram of the semiconductor switch circuit of the fourth embodiment. FIG. 11 is a block diagram of part of the semiconductor switch circuit of the fourth embodiment. Here, the components having the same configuration as those described in the third embodiment are labeled with like reference numerals or symbols, and the description thereof is omitted. Differences from the third embodiment are mainly described.

As shown in FIG. 10, the semiconductor switch circuit 301 according to the embodiment is different from the semiconductor switch circuit 300 according to the third embodiment in that the negative potential Vn and the positive potential Vp are supplied from the DC-DC converter 5 to the driver section 2 in the opposite manner. More specifically, in the semiconductor switch circuit 301, the positive potential Vp is supplied from the DC-DC converter 5 through a second filter to the driver section 2. The second filter is controlled so as to be bypassed when the absolute value of the negative potential Vn has decreased. The semiconductor switch circuit 300 according to the third embodiment is an embodiment for removing harmonic noise in the negative potential Vn. In the semiconductor switch circuit 301 according to the embodiment, the embodiment of the semiconductor switch circuit 300 is diverted to the case of removing harmonic noise in the positive potential. In the following, the semiconductor switch circuit 301 is described as with the semiconductor switch circuit 300.

As described in the case of supplying a positive potential Vp in the semiconductor switch circuit 100 according to the first embodiment, in the configuration of the semiconductor switch circuit 301 according to the embodiment, the DC-DC converter 5 supplies a positive potential Vp (second potential) through a second filter circuit 9p to the driver section 2. A second filter bypass circuit 10p is electrically connected in parallel with the second filter circuit 9p. The positive potential Vp is supplied as the output of a second charge pump circuit 7p in the DC-DC converter 5. The second filter circuit 9p is a low-pass filter including a second filter resistor Rp and a second filter capacitor Cp. The second filter resistor Rp is electrically connected in series between the output terminal of the second charge pump circuit 7p in the DC-DC converter 5 and the positive potential terminal 2p (second potential terminal) of the driver section 2. One end of the second filter capacitor Cp is electrically connected between this second filter resistor Rp and the driver section 2. The other end of the second filter capacitor Cp is grounded. The input terminal of the second filter circuit 9p is one end of the second filter resistor Rp on the DC-DC converter 5 side. The output terminal of the second filter circuit 9p is the other end on the driver section 2 side. Here, the second filter capacitor Cp can also act as a capacitor charged by the current outputted from the second charge pump circuit 7p. The second bypass control circuit 11p is configured to send a second mode signal to the second filter bypass circuit 10p so that when switching of the switch section 1 occurs, the second filter bypass circuit 10p is placed in the conduction state.

Furthermore, the semiconductor switch circuit 301 is configured so that the DC-DC converter 5 supplies a negative potential Vn (first potential) to the driver section 2 through the negative potential terminal 2n (first potential terminal) of the driver section 2. The negative potential Vn is supplied as the output of a first charge pump circuit 7n in the DC-DC converter 5. The semiconductor switch circuit 301 includes a first filter capacitor Cn. One end of the first filter capacitor Cn is electrically connected to the negative potential terminal 2n of the driver section 2. The other end of the first filter capacitor Cn is grounded. This first filter capacitor Cn acts as a capacitor charged by the current outputted from the first charge pump circuit 7n. The input terminal (not shown) of the second bypass control circuit 11p is electrically connected to the negative potential terminal 2n. The negative potential Vn is supplied as an input signal of the second bypass control circuit 11p.

In the semiconductor switch circuit 301 according to the embodiment, the bypass control circuit 11p senses that the absolute value of the potential of the negative potential Vn (the potential of the negative potential terminal) supplied to the driver section 2 has decreased. Thus, the bypass control circuit 11p determines that the switch section 1 is switched. Then, the bypass control circuit 11p sends the second mode signal $V_{mode2}$ to the filter bypass circuit 10p so that the filter bypass circuit 10p is placed in the conduction state. The semiconductor switch circuit 301 according to the embodiment has the same function and effect as the semiconductor switch circuit 300 according to the second embodiment except that the polarity of the potential and the polarity of the MOSFET are reversed.

In the case where switching of the switch section 1 occurs, as in the semiconductor switch circuit 300 according to the third embodiment, the negative potential Vn supplied to the driver section 2 increases, and its absolute value decreases. At the same time, the positive potential Vp supplied to the driver section 2 decreases, and its absolute value decreases. In the semiconductor switch circuit 301 according to the embodiment, contrary to the semiconductor switch circuit 300 according to the third embodiment, the mode signal $V_{mode2}$ is sent to the second filter bypass circuit 10p so that when the second bypass control circuit 11p senses the decrease of the absolute value of the negative potential Vn supplied to the driver section 2, the second filter bypass circuit 10p is placed in the conduction state.

FIG. 11 shows an example of the second bypass control circuit 11p and the second filter bypass circuit 10p of the semiconductor switch circuit 301. The second bypass control circuit 11p includes a second resistor R2 and a second capacitor C2. One end of the second capacitor C2 is electrically connected to the negative potential terminal 2n of the driver section 2. The other end of the second capacitor C2 is electrically connected to one end of the second resistor R2. The other end of the second resistor R2 is electrically connected to the input terminal of the second filter circuit. Here, the other end of the second resistor R2 may be connected to the output terminal of the second filter circuit. The potential of the junction point of the second capacitor C2 and the second resistor R2 is sent to the second filter bypass circuit 10p as a second mode signal $V_{mode2}$ for placing the second filter bypass circuit 10p in the conduction state.

The second filter bypass circuit 10p includes an n-channel MOSFET with the source terminal and the drain terminal electrically connected to the output terminal and the input terminal of the second filter circuit 9p, respectively. The gate electrode of the n-channel MOSFET is supplied with the second mode signal $V_{mode2}$ of the second bypass control circuit 11p.

The operation of the semiconductor switch circuit 301 according to the embodiment is the same as that of the semiconductor switch circuit 300 according to the third embodiment except that the polarity is reversed. Thus, the description thereof is omitted.

Just like the semiconductor switch circuit 300 according to the third embodiment, also in the semiconductor switch circuit 301 according to the embodiment, harmonic noise in the output characteristics is reduced, and good switching response is achieved. The semiconductor switch circuit 300 is advantageous to reduce harmonic noise in the output characteristics in supplying the negative potential Vn. In contrast, the semiconductor switch circuit 301 is advantageous to reduce harmonic noise in supplying the positive potential Vp.

Fifth Embodiment

Figure 12:
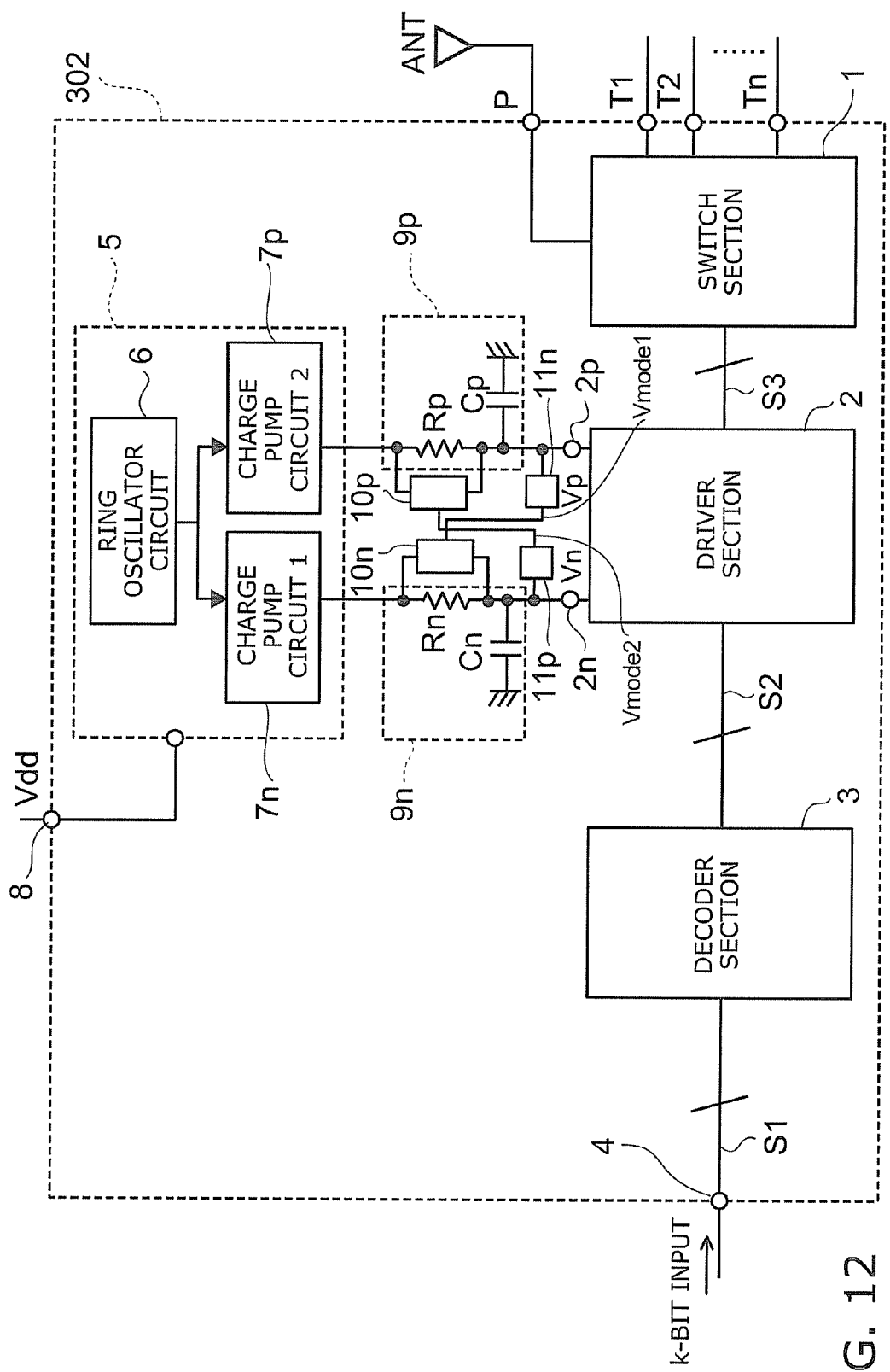
FIG. 12 is a block diagram of a semiconductor switch circuit of a fifth embodiment.
Figure 13:
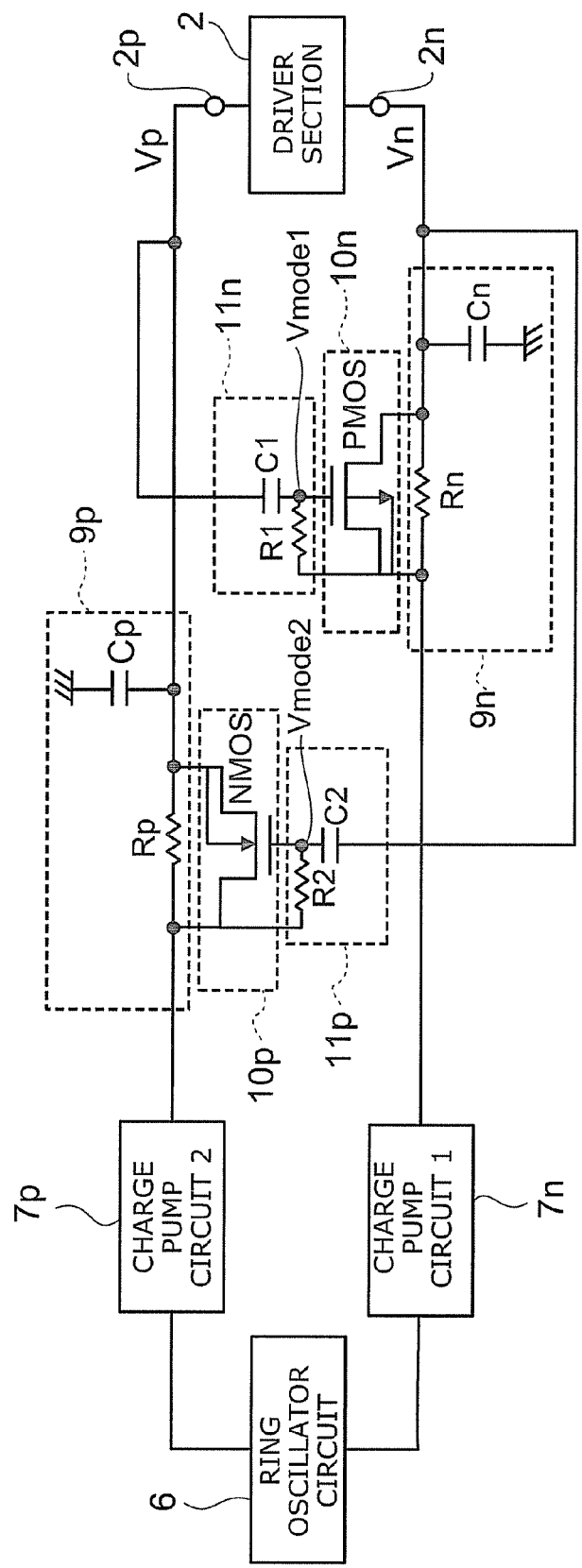
FIG. 13 is a block diagram of part of the semiconductor switch circuit of the fifth embodiment.

A semiconductor switch circuit 302 according to a fifth embodiment is described with reference to FIGS. 12 and 13. FIG. 12 is a block diagram of the semiconductor switch circuit of the fifth embodiment. FIG. 13 is a block diagram of part of the semiconductor switch circuit of the fifth embodiment. Here, the components having the same configuration as those described in the third embodiment and the fourth embodiment are labeled with like reference numerals or symbols, and the description thereof is omitted. Differences from the third embodiment and the fourth embodiment are mainly described.

As shown in FIGS. 12 and 13, the semiconductor switch circuit 302 according to the embodiment is a simple combination of the semiconductor switch circuit 300 according to the third embodiment and the semiconductor switch circuit 301 according to the fourth embodiment. More specifically, the semiconductor switch circuit 302 according to the embodiment has both the function of the semiconductor switch circuit 300 according to the third embodiment and the function of the semiconductor switch circuit 301 according to the fourth embodiment. In the semiconductor switch circuit 300 according to the third embodiment, the negative potential Vn is supplied through the first filter, and the first filter is controlled so as to be bypassed when the absolute value of the positive potential Vp has decreased. In the semiconductor switch circuit 301 according to the fourth embodiment, the positive potential Vp is supplied through the second filter, and the second filter is controlled so as to be bypassed when the absolute value of the negative potential Vn has decreased. Thus, the semiconductor switch circuit 302 can improve switching response while reducing harmonic noise from both the supply system of the negative potential Vn and the supply system of the positive potential Vp.

In the examples described in the above embodiments of the invention, the DC-DC converter 5 steps up the power supply voltage for output. However, the invention is not limited thereto. Also in the case where the DC-DC converter 5 steps down the voltage for output, if the DC-DC converter 5 includes an oscillator and the like generating harmonic noise, the above embodiments can be similarly practiced. Furthermore, in the above description, the first potential and the second potential are the negative potential Vn and the positive potential Vp, respectively. However, this can be read oppositely to practice the above embodiments. Furthermore, in the above description, the negative potential Vn is a potential for turning off the semiconductor switch element in the switch section 1, and the positive potential is a potential for turning on the semiconductor switch element. However, this can be read oppositely by using a p-channel MOSFET as the semiconductor switch element. In the above description, the first potential terminal and the second potential terminal are the negative potential terminal and the positive potential terminal, respectively. However, this can be read oppositely to practice the above embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor switch circuit comprising:
   a switch section including an input-output terminal, a plurality of radio frequency signal terminals, and a plurality of semiconductor switch elements, the plurality of semiconductor switch elements switching a conduction state and a non-conduction state between the input-output terminal and the plurality of radio frequency signal terminals;
   a decoder section configured to generate a switch control signal controlling a conduction state and a non-conduction state of each of the plurality of semiconductor switch elements based on a terminal switching control signal switching the conduction state and the non-conduction state between the input-output terminal and the plurality of radio frequency signal terminals;
   a DC-DC converter configured to generate a first potential;
   a driver section configured to supply the first potential to a gate electrode of one of the semiconductor switch elements placed in one state of the conduction state and the non-conduction state, and to supply a second potential to a gate electrode of one of the semiconductor switch elements placed in one other state of the conduction state and the non-conduction state;
   a first filter circuit electrically connected in series between the DC-DC converter and the driver section and configured to output the first potential to the driver section;
   a first filter bypass circuit electrically connected in parallel with the first filter circuit; and
   a first bypass control circuit configured to supply a first mode signal to the first filter bypass circuit so that the first filter bypass circuit is placed in the conduction state, when the conduction state and the non-conduction state between one of the plurality of radio frequency signal terminals and the input-output terminal are switched.

2. The circuit according to claim 1, wherein the first bypass control circuit supplies the first mode signal to the first filter bypass circuit so that the first filter bypass circuit is placed in the conduction state for a prescribed time, when the first bypass control circuit senses change of the terminal switching control signal.

3. The circuit according to claim 2, wherein the first filter circuit is a low-pass filter including a first filter resistor and a first filter capacitor, the first filter resistor being electrically connected in series between the DC-DC converter and the driver section, one end of the first filter capacitor being electrically connected to one end on a side of the driver section of the first filter resistor, and one other end of the first filter capacitor being grounded.

4. The circuit according to claim 3, wherein the first filter circuit is a low-pass filter including the first filter resistor and the first filter capacitor in multiple stages.

5. The circuit according to claim 3, wherein the first filter bypass circuit is made of a MOSFET with a source electrode electrically connected to one end of the first filter resistor, a drain electrode electrically connected to one other end of the first filter resistor, and a gate electrode supplied with the first mode signal, the first filter bypass circuit bypassing the first filter circuit by being placed in the conduction state.

6. The circuit according to claim 1, wherein the first bypass control circuit supplies the first mode signal to the first filter bypass circuit so that the first filter bypass circuit is placed in the conduction state, when the first bypass control circuit senses decrease of absolute value of the first potential.

7. The circuit according to claim 6, wherein
   the first bypass control circuit includes:
      a bias capacitor with one end electrically connected to a first potential terminal of the driver section supplied with the first potential;
      a bias resistor with one end electrically connected to one other end of the bias capacitor, one other end of the bias resistor being applied with a bias potential; and
      a comparison circuit with a non-inverting input terminal coupled to a junction point of the bias resistor and the bias capacitor, and an inverting input terminal applied with a reference potential, and
   the comparison circuit supplies the first mode signal to the first filter bypass circuit.

8. The circuit according to claim 7, wherein the first filter circuit is a low-pass filter including a first filter resistor and a first filter capacitor, the first filter resistor being electrically connected in series between the DC-DC converter and the driver section, one end of the first filter capacitor being electrically connected to one end on a side of the driver section of the first filter resistor, and one other end of the first filter capacitor being grounded.

9. The circuit according to claim 8, wherein the first filter circuit is a low-pass filter including the first filter resistor and the first filter capacitor in multiple stages.

10. The circuit according to claim 8, wherein the first filter bypass circuit is made of a MOSFET with a source electrode electrically connected to one end of the first filter resistor, a drain electrode electrically connected to one other end of the first filter resistor, and a gate electrode supplied with the first mode signal, the first filter bypass circuit bypassing the first filter circuit by being placed in the conduction state.

11. The circuit according to claim 1, wherein
    the DC-DC converter generates the second potential and supplies the second potential further to the driver section through a second potential terminal, and
    the first bypass control circuit supplies the first mode signal to the first filter bypass circuit so that the first filter bypass circuit is placed in the conduction state, when the first bypass control circuit senses decrease of absolute value of the second potential.

12. The circuit according to claim 11, further comprising:
    a capacitor with one end electrically connected to the second potential terminal and one other end grounded.

13. The circuit according to claim 11, wherein
the first bypass control circuit includes:
   a first capacitor with one end electrically connected to the second potential terminal; and
   a first resistor with one end electrically connected to one other end of the first capacitor, one other end of the first resistor being electrically connected to one end of the first filter circuit on one of a side of the DC-DC converter and a side of the driver section, and
potential of a junction point of the first capacitor and the first resistor is the first mode signal placing the first filter bypass circuit in the conduction state.

14. The circuit according to claim 13, wherein the first filter circuit is a low-pass filter including a first filter resistor and a first filter capacitor, the first filter resistor being electrically connected in series between the DC-DC converter and the driver section, one end of the first filter capacitor being electrically connected to one end on a side of the driver section of the first filter resistor, and one other end of the first filter capacitor being grounded.

15. The circuit according to claim 14, wherein the first filter circuit is a low-pass filter including the first filter resistor and the first filter capacitor in multiple stages.

16. The circuit according to claim 14, wherein the first filter bypass circuit is made of a MOSFET with a source electrode electrically connected to one end of the first filter resistor, a drain electrode electrically connected to one other end of the first filter resistor, and a gate electrode supplied with the first mode signal, the first filter bypass circuit bypassing the first filter circuit by being placed in the conduction state.

17. The circuit according to claim 11, further comprising:
   a second filter circuit electrically connected in series between the DC-DC converter and the driver section and configured to output the second potential to the driver section;
   a second filter bypass circuit electrically connected in parallel with the second filter circuit; and
   a second bypass control circuit,
   the second bypass control circuit supplying a second mode signal to the second filter bypass circuit so that the second filter bypass circuit is placed in the conduction state for a prescribed time, when the second bypass control circuit senses decrease of absolute value of the first potential.

18. The circuit according to claim 17, wherein
the first bypass control circuit includes:
   a first capacitor with one end electrically connected to the second potential terminal; and
   a first resistor with one end electrically connected to one other end of the first capacitor, one other end of the first resistor being electrically connected to one end of the first filter circuit on one of a side of the DC-DC converter and a side of the driver section, and
potential of a junction point of the first capacitor and the first resistor is the first mode signal placing the first filter bypass circuit in the conduction state, and
the second bypass control circuit includes:
   a second capacitor with one end electrically connected to a first potential terminal supplying the first potential to the driver section; and
   a second resistor with one end electrically connected to one other end of the second capacitor, one other end of the second resistor being electrically connected to one end of the second filter circuit on one of a side of the DC-DC converter and a side of the driver section, and
potential of a junction point of the second capacitor and the second resistor is the second mode signal placing the second filter bypass circuit in the conduction state.

19. The circuit according to claim 18, wherein
the first filter circuit is a low-pass filter including a first filter resistor and a first filter capacitor, the first filter resistor being electrically connected in series between the DC-DC converter and the driver section, one end of the first filter capacitor being electrically connected to one end on a side of the driver section of the first filter resistor, and one other end of the first filter capacitor being grounded, and
the second filter circuit is a low-pass filter including a second filter resistor and a second filter capacitor, the second filter resistor being electrically connected in series between the DC-DC converter and the driver section, one end of the second filter capacitor being electrically connected to one end on a side of the driver section of the second filter resistor, and one other end of the second filter capacitor being grounded.

20. The circuit according to claim 19, wherein
the first filter bypass circuit is made of a MOSFET with a source electrode electrically connected to one end of the first filter resistor, a drain electrode electrically connected to one other end of the first filter resistor, and a gate electrode supplied with the first mode signal, and
the second filter bypass circuit is made of a MOSFET with a source electrode electrically connected to one end of the second filter resistor, a drain electrode electrically connected to one other end of the second filter resistor, and a gate electrode supplied with the second mode signal,
the first filter bypass circuit bypassing the first filter circuit by being placed in the conduction state, and the second filter bypass circuit bypassing the second filter circuit, by being placed in the conduction state.

* * * * *